United States Patent
Shimizu et al.

[11] Patent Number: 5,976,312
[45] Date of Patent: Nov. 2, 1999

[54] SEMICONDUCTOR PROCESSING APPARATUS

[75] Inventors: Akira Shimizu; Peirong Hu, both of Tama, Japan

[73] Assignee: ASM Japan K.K., Tokyo, Japan

[21] Appl. No.: 08/856,215

[22] Filed: May 14, 1997

[30] Foreign Application Priority Data

May 15, 1996 [JP] Japan ..................................... 8-143432
Apr. 9, 1997 [JP] Japan ..................................... 9-105446

[51] Int. Cl.$^6$ .............................. C23F 1/00; C23C 16/00
[52] U.S. Cl. ......................... 156/345; 118/730; 118/733
[58] Field of Search ............................. 156/345; 118/730, 118/733

[56] References Cited

U.S. PATENT DOCUMENTS 5,016,576  5/1991  Iwabuchi et al. ....................... 118/733

*Primary Examiner*—William Krynski
*Assistant Examiner*—Chris Cronin
*Attorney, Agent, or Firm*—Knobbe Martens, Olson & Bear, LLP

[57] ABSTRACT

There is provided an integrated semiconductor processing apparatus which produces less dust. The apparatus comprises a reaction chamber, a boat means, a motor, and a sealing mechanism. The sealing mechanism includes a movable sealing means which serves as a non-contact seal when a wafer is being rotated and which serves as a contact seal when the wafer is static. The movable sealing means is an expandable elastic seal comprising an expandable elastic member. By increasing the pressure inside the expandable elastic seal, the surface of the elastic seal is put in contact with a rotating shaft to achieve perfect sealing. The internal pressure of the expandable elastic seal can be adjusted to control the contact and non-contact state of the seal. The apparatus according to the invention suppresses generation of dust in all steps of etching to improve production yield.

7 Claims, 3 Drawing Sheets

SEMICONDUCTOR PROCESSING APPARATUS

BACKGROUND OF THE INVENTION

1. Field of the Invention

The present invention relates to an apparatus for manufacturing semiconductor wafers and, more particularly, to an apparatus for etching semiconductor wafers.

2. Description of Related Art

Methods referred to as "dry etching" and "wet etching" are known as methods for etching a silicon oxide film on a semiconductor wafer. Dry etching is a method wherein a semiconductor wafer is etched by exposing it in an atmosphere of an etching gas such as HF or HF/H$_2$O. On the other hand, wet etching is a method wherein a semiconductor wafer is etched by immersing it in, for example, a water solution of HF for a predetermined period of time. Recently, due to increasing demand for highly integrated devices, dry etching that provides higher etching efficiency has been the mainstream art.

However, dry etching also has a problem in that by-products of etching remain on the surface of a wafer. The dry-wet-dray etching system has been conceived taking such a situation into consideration. The dry-wet-dray etching is a method in which the surface of a wafer is sufficiently cleaned by pure water or the like after dry etching as described above and is dried by evaporating moisture thereon. This method eliminates the possibility of contamination by by-products after dry etching.

However, in order to implement the dry-wet-dry scheme, a dry etching apparatus, a cleansing apparatus, and drying apparatus must be prepared separately, which has resulted in a problem associated with the space for such apparatuses and a problem of contamination during transportation of wafers between those apparatuses.

Conventional apparatuses had another problem in that magnetic seals which produce less dust can not be used as sealing members at the step of dry-etching for reasons with respect to corrosion resistance.

While the spin drying system in which a wafer is rotated to scatter water droplets with a centrifugal force is generally utilized as drying method at the step of drying, there has been a possibility of contamination of a wafer due to dust produced by friction at rotating portions during the step.

It is therefore an object of the present invention to provide an integrated semiconductor processing apparatus in which the above-described dry-wet-dry etching scheme can be easily implement at a time.

It is another object of the present invention to provide a sealing mechanism which prevents dust from rotating portions or from the outside of a reaction chamber from contaminating a semiconductor wafer during executing all steps of dry-wet-dry etching.

SUMMARY OF THE INVENTION

In order to achieve the above-described objects, a semiconductor processing apparatus according to the present invention comprises means as described below.

An apparatus for processing a semiconductor wafer according to the present invention comprises:

a reaction chamber;

a retaining means for retaining the semiconductor wafer in the reaction chamber;

a rotational power source fir supplying a rotating force to the retaining means; and a sealing mechanism provided between the rotational power source and the retaining means for isolating the reaction chamber from the outside. The sealing mechanism is characterized in that it includes a movable sealing means which serves as a non-contact seal when the retaining means is being rotated and which serves as a contact seal when the retaining means is static.

Specifically, the movable sealing means comprises an expandable elastic member, and volume of which is expanded by increasing gas pressure inside the movable sealing means to put the surface of the expandable elastic member in tight contact with the rotating shaft so that perfect sealing is achieved.

The sealing mechanism may include a magnetic sealing means. Evacuation may be performed between the movable sealing means and the magnetic sealing means.

Preferably, the retaining means is a boat means for retaining at least one semiconductor wafer vertically stacked thereon at predetermined intervals.

Further, the reaction chamber may include:

at least one outlet port for evacuating the reaction chamber;

at least one drainage port; and at least one injector means.

Furthermore, the semiconductor processing apparatus according to the present invention may include an elevating means for transporting the semiconductor wafer into and out of the reaction chamber.

Specifically, the elevating means may comprises:

a ball screw mechanically sealed from the reaction chamber;

a guide member engaged with the ball screw for elevating the boat means; and a rotary driving device for rotating the ball screw.

DETAILED DESCRIPTION OF PREFERRED EMBODIMENT

Figure 1:
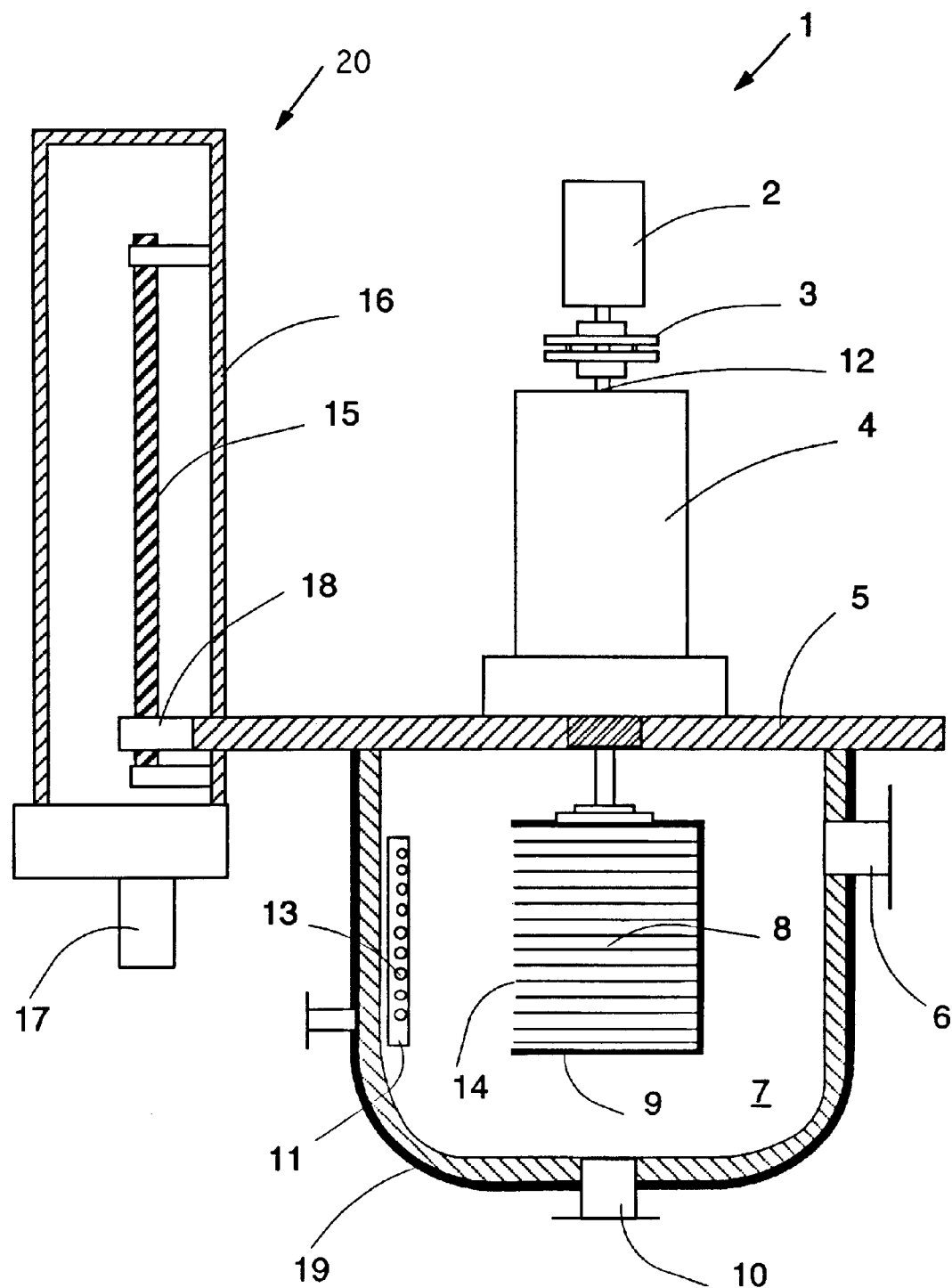
FIG. 1 is a sectional view of a preferred embodiment of a semiconductor processing apparatus of the present invention.

The present invention will now be described with reference to the drawings. FIG. 1 is a sectional view of a preferred embodiment of a semiconductor processing apparatus according to the present invention. A semiconductor processing apparatus 1 according to the present invention comprises a reaction chamber 7, a boat means 9 for retaining a semiconductor wafer 8 in the reaction chamber, a motor means 2 for applying a rotational force to the boat means 9, and a sealing mechanism 4 provided between the motor means 2 and boat means 9 for isolating the interior of the reaction chamber 7 from the outside. Preferably, a coupling means 3 is mounted between the motor means 2 and sealing mechanism 4 for transferring the rotational force to a rotating shaft 12, and a door 5 for keeping airtightness of the reaction chamber 7 is provided at an open end thereof.

The reaction chamber 7 is a normal type made of stainless steel coated with Teflon or is made of a nickel alloy with corrosion resistance. Preferably, the reaction chamber 7 is entirely covered by a silicon rubber heater 19. An outlet port 6 is provided on a side wall of the reaction chamber 7 for exhausting an etching gas (HF or HF+$H_2O$) or a purge gas (preferably $N_2$). Further, a drainage port 10 is provided on the bottom of the reaction chamber 7 for draining pure water used for cleaning. The outlet port 6 and drainage port 10 are provided separately, and a plurality of each of those parts may be provided if desired. Furthermore, an injector 11 comprising a hollow thin tube is provided along the surface of an inner wall of the reaction chamber. A plurality of apertures 13 are provided on a side of the injector 11 at predetermined intervals to eject the etching gas, purge gas or pure water. Preferably, separate injector means are provided for the gas and pure water.

The boat means 9 includes a mounting portion 14 for vertically stacking a plurality of semiconductor wafers in parallel with each other at predetermined intervals in the range from 4 to 20 mm. Preferably, the intervals at the mounting portion 14 are set equal to that of the apertures of the injector 11. The upper end of the boat means 9 is coupled to a rotating shaft 12 for transferring a rotational power from the motor means 2 and, as a result, the boat means 9 is linked with the motor 2 through the door 5, sealing mechanism 4, and coupling 3.

As the motor means 2, it is preferable to use a normal electric motor whose rotational speed can be controlled in the range from 1 to 2000 rpm. The rotational speed can be controlled at the range from 1 to 1000 rpm during cleaning of a wafer and at the range from 500 to 2000 rpm during drying of the same.

The sealing mechanism 4 includes a movable sealing means as described below in detail. The movable sealing means makes it possible to achieve perfect sealing both when a semiconductor wafer is being rotated and when the wafer is static and to completely prevent contamination by dust produced by friction at rotating portions and dust from the outside of the reaction chamber during all steps of dry-wet-dry etching process.

The semiconductor processing apparatus 1 according to the present invention may further include an elevating means 20 for mechanically elevating the boat means 9 when a semiconductor wafer is loaded or unloaded. The elevating means 20 comprises a shield member 16 for suppressing generation of dust, a ball screw 15 of which surface is threaded on vertically provided in the shielding member, a guide member 18 engaged with the ball screw 15 and coupled with one end of the door 5, and a motor 17 for rotating the ball screw 15. When the ball screw 15 is rotated in a predetermined direction by the motor 17, the door 5 along with the guide member 18 moves upward. This causes the boat means 9 and the parts located above the same in FIG. 1 to be moved upward all together, thereby allowing a wafer to be loaded and unloaded.

Figure 2:
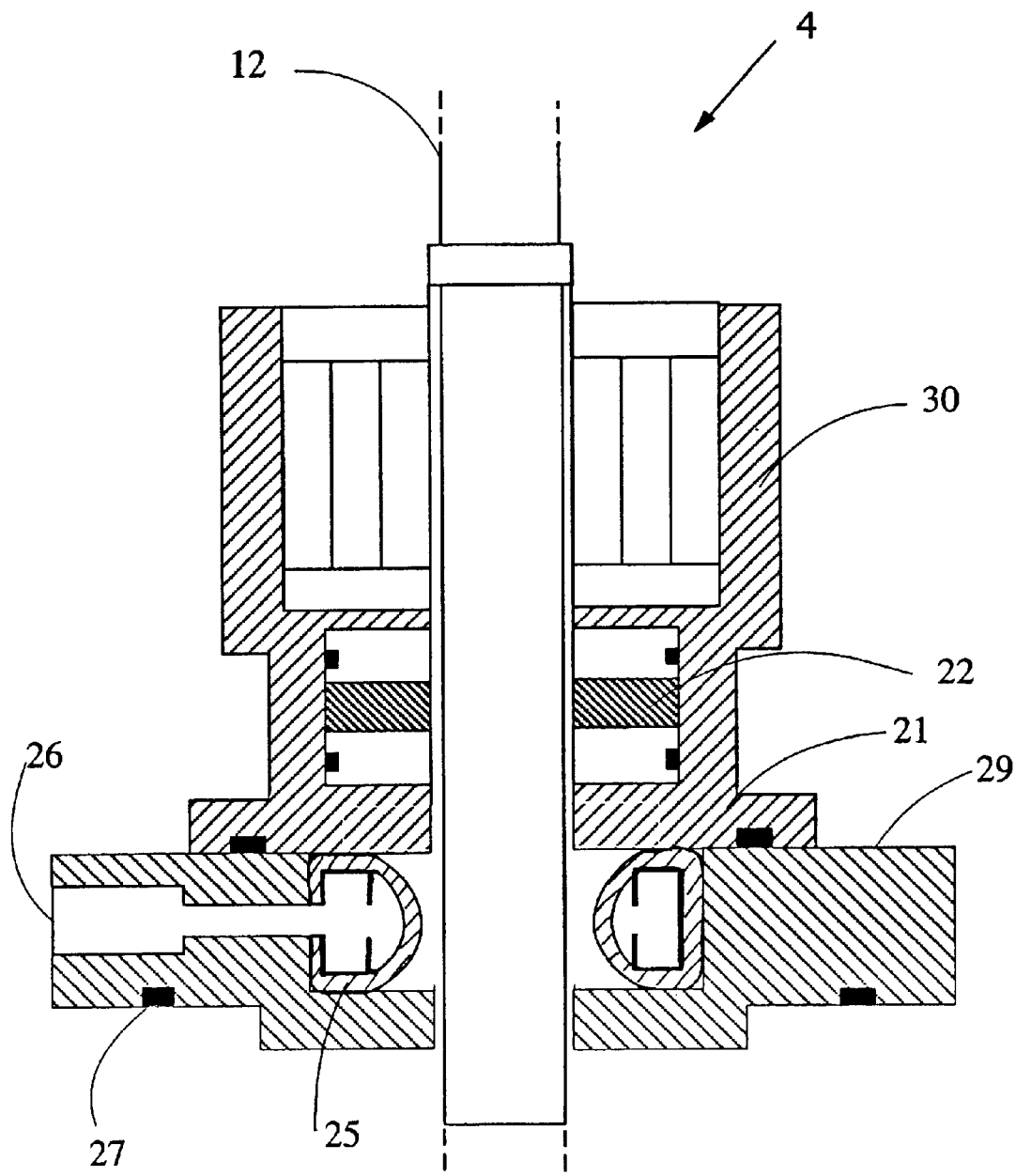
FIG. 2 is an enlarged sectional view of a sealing mechanism of the apparatus in FIG. 1.

FIG. 2 is an enlarged sectional view of a sealing mechanism of the semiconductor processing apparatus according to the present invention. A sealing mechanism 20 according to the present invention comprises a bearing box 30, a magnetic seal 22, an expandable elastic seal 25, and a housing 21 for enclosing them. The expandable elastic seal 25 is preferably a rubber seal made of either natural rubber, synthetic rubber or silicon rubber and is in communication with a port 26 provided on a side of the housing. As the air pressure in the expandable elastic seal 25 is increasing, the volume of which is also expanded, and thereby an inner rubber surface of the elastic seal puts in tight contact with the rotating shaft 12 so as to achieve sealing (see FIG. 3). A port 23 is provided on a side of the housing to evacuate the space between the magnetic seal 22 and expandable elastic seal 25 in the housing. The door 5 and sealing mechanism 14 in FIG. 1 are engaged with each other at a flange 29 and are sealed by a seal surface 27. The region of near the engaging portion of the rotating shaft 12 with the housing is made of a nickel type corrosion resistant alloy.

A description will now be made on a method of etching a semiconductor wafer utilizing the above-described semiconductor processing apparatus according to the present invention. The apparatus shown in FIG. 1 can be used to implement dry-wet-dry etching scheme according to the method described below.

Figure 3:
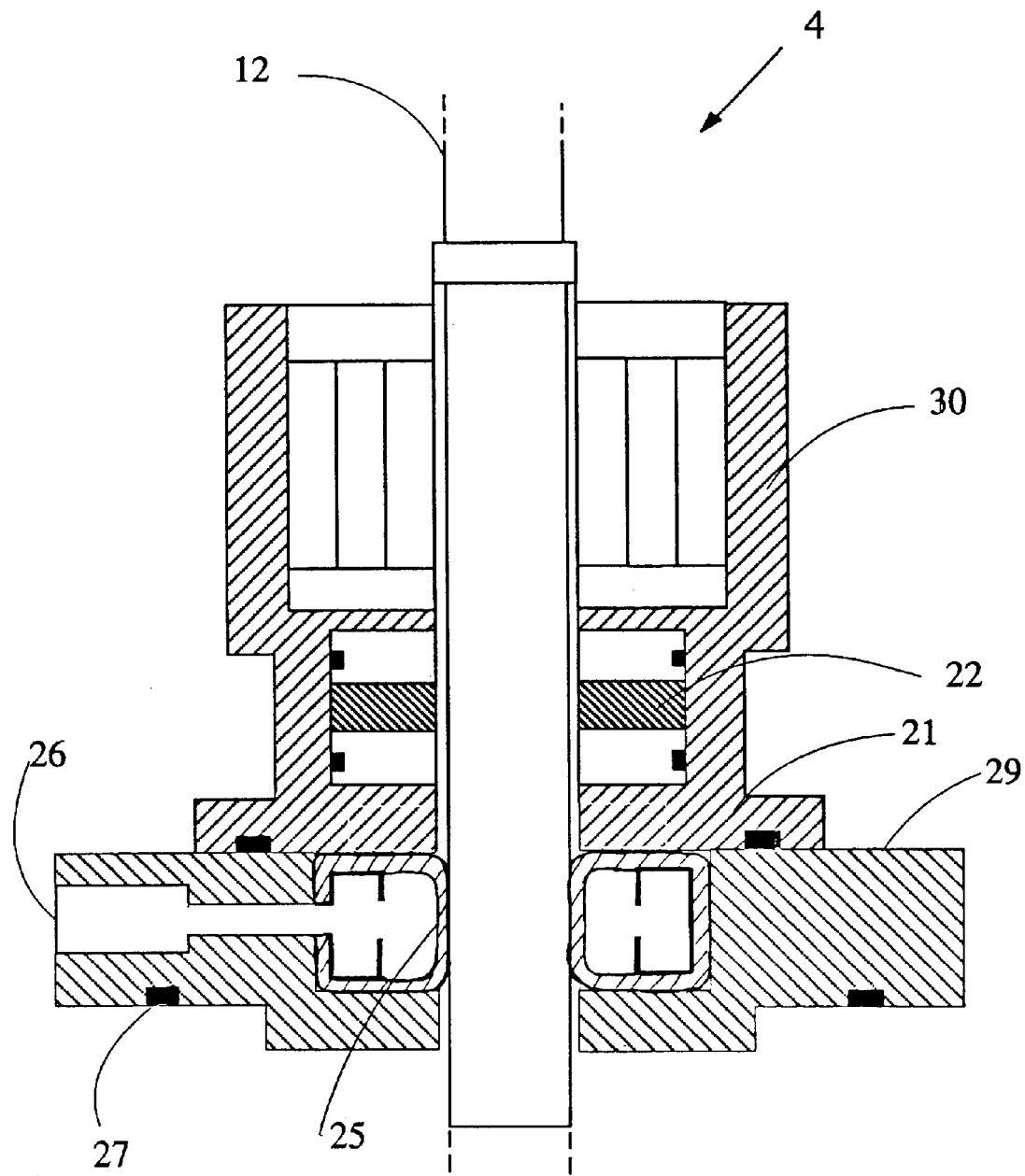
FIG. 3 is another enlarged sectional view of a sealing mechanism of the apparatus in FIG. 1.

In an etching process, first of all, a semiconductor wafer 8 is loaded to the boat means 9 and, thereafter, the elevating means 20 is actuated to transport the wafer into the reaction chamber 7. Next, the reaction chamber 7 is evacuated, and the etching gas HF or HF+$H_2O$ [HF:$H_2O$=(99.999% to 0.001%); (0.001% to 99.999%)] is introduced into the reaction chamber 7 from the injector means 11. At this time, the pressure inside the reaction chamber 7 is maintained at 5 to 80000 Pa and preferably at 10 to 13300 Pa. During this step, the pressure of the expandable elastic seal 25 of the sealing mechanism 4 is adjusted such that the inner rubber surface thereof is entirely in tight contact with the rotating shaft to cover the entire periphery of the rotating shaft as shown in FIG. 3 (see FIG. 3). The expandable elastic seal 25 achieves perfect sealing in combination with the magnetic seal 22 provided for preventing entrainment of the atmosphere during rotation. In order to enhance the sealing effect further, the space between the magnetic seal and the expandable elastic seal 25 may be also evacuated. This makes it possible to prevent generation of even a microscopic amount of dust from the magnetic seal completely.

When etching is completed, a purge gas (preferable $N_2$) is injected by the injector means 11 to exhaust the etching gas in the reaction chamber completely, thereby the atmospheric pressure is restored in the chamber. In this state, another injector means (not shown) injects pure water for cleaning a wafer toward the wafers 8 mounted on the boat means 9. The pure water for cleaning may be used after adding alcohol or the like thereto to reduce the surface tension thereof. At the same time when the atmospheric pressure is restored in the reaction chamber, the pressure of the expandable elastic seal 25 of the sealing mechanism 4 is adjusted such that the inner rubber surface thereof leaves the side surface of the rotating shaft and get into a non-contact state (see FIG. 2). After the expandable elastic seal 25 is brought into the non-contact state, the semiconductor wafers are cleaned by the pure water injected by the above-described injector while the boat means 9 is rotated at 1 to 1000 rpm by the motor 2. The interior of the sealing mechanism is evacuated also during the cleaning step to prevent generation of a microscopic amount of dust from the magnetic seal completely. Since only $N_2$ gas exists in the reaction chamber at the cleaning step, there is no possibility of corrosion and the magnetic seal 22 can be used alone.

Finally, $N_2$ gas for drying is injected again from the above-described injector means 11 toward the semiconductor wafers at a drying step. Throughout the drying step, a whole of the reaction chamber 7 is heated by the silicon rubber heater 19. Preferably, the $N_2$ gas for drying is also used after preheating. Drying is implemented at a reduced pressure while evacuating the interior of the reaction chamber. The expandable elastic seal 25 is kept in the non-contact state. Drying is implemented while rotating the boat means 9 at 500 to 2000 rpm by the motor 2. After drying, the elevating means 20 is actuated to transport the semiconductor wafers 8 mounted on the boat means 9 out of the reaction chamber 7.

The semiconductor processing apparatus according to the present invention has allowed dry-wet-dry etching to be easily performed with one apparatus, thereby improving operating efficiency.

Further, significant suppression of contamination due to dust could be achieved at all steps for performing dry-wet-dry etching. It has been confirmed that the apparatus according to the invention suppresses the number of particles equal to or greater than 0.3 $\mu$ existing on a wafer of eight inches to the range from 0 to 5 while conventional apparatuses have produced such particles in the range from 1000 to 10000 count. It is expected that a production yield can be improved.

While the invention has been particularly shown and described with reference to a preferred embodiment, it will be understood by those skilled in the art that various changes in form and detail may be made without departing from the spirit and scope of the invention.

What is claimed is:

1. An apparatus for processing a semiconductor wafer according comprising:
    a reaction chamber;
    a retaining means for retaining said semiconductor wafer in said reaction chamber;
    a rotational power source for supplying a rotating force to said retaining means; and
    a sealing mechanism provided between said rotational power source and said retaining means for isolating said reaction chamber from the outside, wherein
    said sealing mechanism includes a movable sealing means which serves as a non-contact seal when said retaining means is being rotated and which serves as a contact seal when said retaining means is static.

2. An apparatus according to claim 1, wherein said movable sealing means of said sealing mechanism comprises an expandable elastic member, and wherein the volume of which is expanded by increasing the internal pressure of said movable sealing means to put a surface of the expandable elastic member in tight contact with a rotating shaft so that perfect sealing is achieved.

3. An apparatus according to claim 2, wherein said sealing mechanism further includes a magnetic sealing means and wherein the space between said movable sealing means and said magnetic sealing means is evacuated.

4. An apparatus according to claim 1, wherein said retaining means is a boat means for retaining at least one semiconductor wafer vertically stacked thereon at predetermined intervals.

5. An apparatus according to claim 1, wherein said reaction chamber includes:
    at least one outlet port for evacuating said reaction chamber;
    at least one drainage port; and
    at least one injector means.

6. An apparatus according to claim 5, further comprising an elevating means for transporting said semiconductor wafer into and out of said reaction chamber.

7. An apparatus according to claim 6, wherein said elevating means comprises:
    a ball screw mechanically sealed from said reaction chamber;
    a guide member engaged with said ball screw for elevating said boat means; and
    a rotary driving device for rotating said ball screw.

* * * * *